(12) United States Patent
Ikeda et al.

(10) Patent No.: US 8,729,603 B2
(45) Date of Patent: May 20, 2014

(54) GAN-BASED SEMICONDUCTOR ELEMENT

(75) Inventors: Nariaki Ikeda, Tokyo (JP); Seikoh Yoshida, Tokyo (JP)

(73) Assignee: Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 13/444,936

(22) Filed: Apr. 12, 2012

(65) Prior Publication Data
US 2012/0193639 A1  Aug. 2, 2012

Related U.S. Application Data

(63) Continuation of application No. 12/535,071, filed on Aug. 4, 2009, now Pat. No. 8,178,898, which is a continuation of application No. 12/323,051, filed on Nov. 25, 2008, now abandoned, which is a continuation of application No. 12/053,841, filed on Mar. 24, 2008, now abandoned.

(30) Foreign Application Priority Data

Mar. 23, 2007  (JP) ................................. 2007-076004

(51) Int. Cl.
  *H01L 29/205*  (2006.01)
(52) U.S. Cl.
  USPC ............. 257/190; 257/192; 257/76; 257/183; 257/E29.091

(58) Field of Classification Search
  USPC ...................... 257/190, 76, 192, 183, E29.091
  See application file for complete search history.

(56) References Cited

U.S. PATENT DOCUMENTS

| 7,338,826 | B2 * | 3/2008 | Mittereder et al. ............. 438/38 |
| 7,687,828 | B2 * | 3/2010 | Matsuo et al. ................. 257/194 |
| 2006/0073621 | A1 * | 4/2006 | Kneissel et al. ................ 438/21 |
| 2006/0091430 | A1 * | 5/2006 | Sriram et al. .................. 257/280 |
| 2006/0138456 | A1 * | 6/2006 | Parikh et al. ................... 257/194 |
| 2006/0202272 | A1 | 9/2006 | Wu et al. |
| 2007/0114569 | A1 * | 5/2007 | Wu et al. ......................... 257/194 |
| 2007/0205433 | A1 * | 9/2007 | Parikh et al. ................... 257/192 |
| 2007/0235761 | A1 * | 10/2007 | Parikh et al. ................... 257/194 |
| 2007/0295990 | A1 * | 12/2007 | Higashiwaki ................. 257/192 |
| 2011/0220966 | A1 * | 9/2011 | Wu et al. ......................... 257/194 |

FOREIGN PATENT DOCUMENTS

| JP | 2003-059948 | 2/2003 |
| JP | 2006-173582 | 6/2006 |

* cited by examiner

*Primary Examiner* — Victor A Mandala
(74) *Attorney, Agent, or Firm* — Lowe Hauptman & Ham, LLP

(57) ABSTRACT

A GaN-based semiconductor element includes a substrate, a buffer layer formed on the substrate, including an electrically conductive portion, an epitaxial layer formed on the buffer layer, and a metal structure in ohmic contact with the electrically conductive portion of the buffer layer for controlling an electric potential of the buffer layer.

13 Claims, 2 Drawing Sheets

GAN-BASED SEMICONDUCTOR ELEMENT

CROSS REFERENCE TO RELATED APPLICATIONS

This application is a continuation of U.S. patent application Ser. No. 12/535,071, filed on Aug. 4, 2009, which is a continuation of U.S. patent application Ser. No. 12/323,051, filed on Nov. 25, 2008, which is a continuation of U.S. patent application Ser. No. 12/053,841, filed on Mar. 24, 2008, which claims priority from Japanese patent application No. 2007-076004, filed on Mar. 23, 2007, the entire content of all of the above-listed applications is incorporated herein by reference.

BACKGROUND OF THE INVENTION

1. Technical Field

The present invention relates to a GaN-based semiconductor element, such as a GaN-based heterojunction field effect transistor or the like.

2. Related Arts

A development of a field effect transistor (FET) is progressed using materials for a gallium nitride (GaN) based semiconductor, especially using a GaN/AlGaN based semiconductor materials, because the GaN-based semiconductor has a wider band gap energy than that of a semiconductor using GaAs-based materials and has a high heat resistance as it shows a superior performance in a high temperature.

So far, there is disclosed a GaN-based high electron mobility transistor (HEMT) comprised of a GaN-based compound semiconductor for an FET using a GaN-based semiconductor in a published Japanese patent application No. 2006-173582 (hereinafter, it is described as a document 1). In such the GaN-based HEMT, a buffer layer is formed as required. Moreover, a carrier transport layer and a carrier supply layer are epitaxial grown in order thereunto. Furthermore, electrodes are formed thereunto.

Moreover, there is disclosed a structure in a published Japanese patent application No. 2003-059948 (hereinafter, it is described as a document 2) as another conventional technology, wherein a region of a GaN-based semiconductor for HEMT element is formed on a buffer layer comprising a multilayered structure including a first layer comprised of an AlN layer and a second layer comprised of a GaN layer are alternately layered on a substrate of silicon.

So far, the GaN-based HEMT structure is used for a horizontal element as disclosed in the above mentioned document 1 and 2. However, it is required to use a high resistance buffer layer, as it is necessary to reduce a leakage current flowing through the buffer layer for obtaining the buffer layer with a high withstand voltage at the time of forming an element for a high withstand voltage and a large current. Moreover, there are provided problems that an on-resistance is increased and consequently an element cannot help but be broken down due to occurring a current collapse (a current slump) by being fluctuated an electric potential of a semiconductor layer (the buffer layer) neighboring to a substrate at the time of performing a high voltage switching in the case of using a sapphire as an insulator for the substrate.

BRIEF SUMMARY OF THE INVENTION

The present invention is presented with having regard to the above mentioned conventional problems, and an object is to provide a GaN-based semiconductor element to be able to suppress the current collapse even at the time of performing the high voltage switching.

For solving the above mentioned problems, a GaN-based semiconductor element according to a first aspect of the present invention comprises: a substrate; a buffer layer formed on the substrate; and an epitaxial layer formed on the buffer layer, wherein a part or whole of the buffer layer is formed to be an electro-conductive semiconductor layer, and a structure to be able to control an electric potential of the electro-conductive semiconductor layer is included.

According to the aspect, it is able to fix the electric potential of the electro-conductive semiconductor layer comprising the part or whole of the buffer layer by the structure to be able to control the electric potential of the electro-conductive semiconductor layer. Hence, it is able to suppress the current collapse (the current slump) occurred by being fluctuated the electric potential of the semiconductor layer (the buffer layer) neighboring to the substrate at the time of performing the high voltage switching. Therefore, it becomes able to prevent the on-resistance from being increased and the element from cannot help but be consequently broken down due to occurring the current collapse.

In the GaN-based semiconductor element according to a second aspect of the present invention, the structure includes a part of electrodes or a part of metal materials implanted into the epitaxial layer to be extended to a depth reaching the buffer layer for ohmic contacting to the buffer layer.

According to the aspect, it is able to fix the electric potential of the electro-conductive semiconductor layer comprising the part or whole of the buffer layer be for being equal to the electric potential of a part of the electrodes or a part of the metal materials. That is to say, it is able to control the electric potential of the electro-conductive semiconductor layer to be a predetermined electric potential by using the part of the electrodes or by using the part of the metal materials. Hence, it is able to suppress the current collapse occurred by being fluctuated the electric potential of the buffer layer neighboring to the substrate at the time of performing the high voltage switching.

In the GaN-based semiconductor element according to a third aspect of the present invention, a part of the electrodes is structured for having the electric potential similar to that of a source electrode.

According to the aspect, it is able to control the electric potential of the electro-conductive semiconductor layer comprising the part or whole of the buffer layer to be a predetermined electric potential by using the source electrode. Hence, it is able to suppress the current collapse occurred by being fluctuated the electric potential of the buffer layer neighboring to the substrate at the time of performing the high voltage switching.

In the GaN-based semiconductor element according to a fourth aspect of the present invention, the structure comprises a metal layer selectively formed to be ohmic contacted to the buffer layer at a part of a region that the buffer layer is formed on the substrate, a part of the electrodes or a part of the metal materials is implanted into the epitaxial layer formed on the buffer layer and on the metal layer to be extended to a depth reaching the metal layer for electrically contacting to the metal layer.

According to the aspect, it is able to control the electric potential of the electro-conductive semiconductor layer comprising the part or whole of the buffer layer to be a predetermined electric potential by the part of the electrodes or the part of the metal materials and by the meal layer. Hence, it is able to suppress the current collapse occurred by being fluctuated the electric potential of the buffer layer neighboring to the substrate at the time of performing the high voltage switching.

In the GaN-based semiconductor element according to a fifth aspect of the present invention, the structure comprises a metal layer selectively formed to be ohmic contacted to the buffer layer at a part of a region that the buffer layer is formed on the substrate, and a deep mesa structure is formed in a part of the epitaxial layer formed on the buffer layer, and an electrode is formed on a part of the metal layer exposed by opening the part on the metal layer.

According to the aspect, it is able to control the electric potential of the electro-conductive semiconductor layer comprising the part or whole of the buffer layer to be a predetermined electric potential, by using an electrode formed on a part of the metal layer ohmic contacting to the buffer layer and by using the metal layer. Hence, it is able to suppress the current collapse occurred by being fluctuated the electric potential of the buffer layer neighboring to the substrate at the time of performing the high voltage switching.

In the GaN-based semiconductor element according to a sixth aspect of the present invention, the metal layer is formed using any of metal materials, such as Ni, Nb, Mo, Ta, W, Re, Os, Ir, Pt, or the like.

According to the aspect, it becomes able to obtain an excellent ohmic contact to between the buffer layer and the metal layer.

In the GaN-based semiconductor element according to a seventh aspect of the present invention, the buffer layer is to be any one of a buffer layer comprised of an n-GaN layer having n-type conductivity, a buffer layer comprised of a layered structure of an AlN layer and a GaN layer and comprised of an n-GaN layer having n-type conductivity formed on the layered structure, or a buffer layer comprised of an n-AlN layer having n-type conductivity.

The GaN-based semiconductor element according to an eighth aspect of the present invention further comprises: said buffer layer; a channel layer comprised of a undoped GaN layer formed on said buffer layer; an electron supply layer comprised of an AlGaN layer formed on the channel layer; and a gate electrode, a source electrode and a drain electrode formed on the electron supply layer respectively, wherein a structure to be able to function as a GaN-based heterojunction field effect transistor is included.

In the GaN-based heterojunction field effect transistor, the strongest electric field is applied to between the gate electrode and the drain electrode at the time of turning off and the electric field flocks to around an edge of the gate electrode at the drain electrode side. However, according to the eight aspect, it is able to relax the flock of the electric field by fixing the electric potential of the electro-conductive semiconductor layer comprising the part or whole of the buffer layer (to be a predetermined electric potential).

According to the aspect, it becomes able to realize a GaN-based semiconductor element to be able to suppress the current collapse even at the time of performing the high voltage switching.

Moreover, it is able to reduce the leakage current flowing through a substrate even in the case of forming a large element with using an electro-conductive substrate, such as a silicon substrate or the like, and it becomes possible to realize the large element for the large current and the high withstand voltage, because a plurality of the GaN-based semiconductor elements are insulated and discrete at the substrate or neighborhood of the substrate for each of the elements respectively. For example, it becomes possible to reduce the buffer leakage current to be $10^{-9}$ or $10^{-10}$ A at 200 V as approximately three to four orders of magnitude reduced from that of the conventional as $10^{-6}$ A order at 200 V. Hence, it becomes possible to realize the large element for the high withstand voltage and the low leakage current, as it becomes possible to obtain a withstand break down voltage of approximately 1200 V comparing to that of the conventional as approximately 600 V. Therefore, it becomes also possible to apply to such as an inverter, a converter, or the like, wherein the high withstand voltage is required. Thus, it becomes possible to realize the GaN-based semiconductor element, such as the GaN-based field effect transistor or the like, for the high withstand voltage and the low leakage current.

BRIEF DESCRIPTION OF THE DRAWINGS

The above and other objects and features of the invention will appear more fully hereinafter from a consideration of the following description taken into connection with the accompanying drawing wherein one example is illustrated by way of example, in which.

DETAILED DESCRIPTION OF THE INVENTION

Next, every embodiment embodied the present invention will be described in detail below, based on the drawings. Here, a duplicated description is omitted with using a similar symbol for the similar component part regarding the description of every embodiment.

First Embodiment

Figure 1:
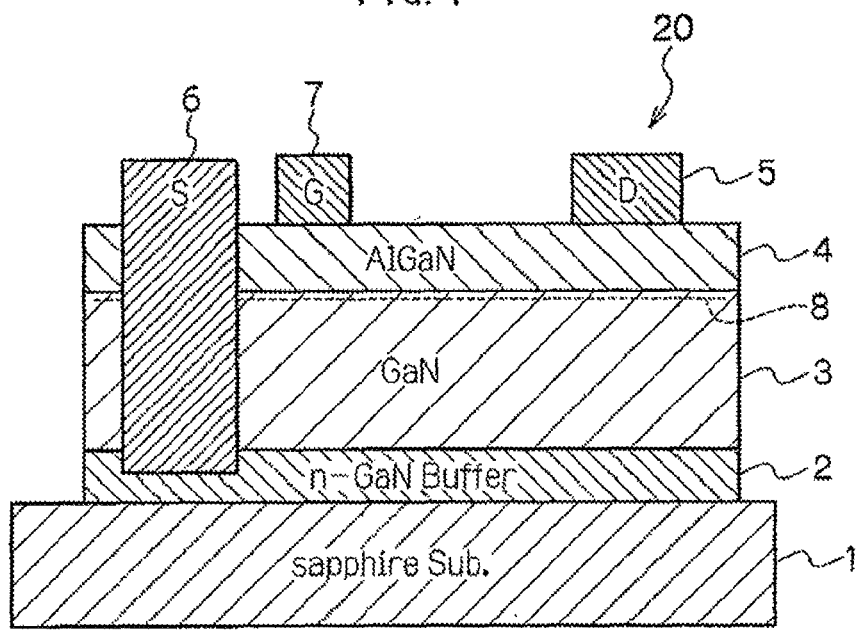
FIG. 1 is a cross sectional view showing a schematic configuration of a GaN-based semiconductor element according to the first embodiment of the present invention.

A GaN-based semiconductor element 20 according to the first embodiment of the present invention will be described in detail below, based on FIG. 1.

The GaN-based semiconductor element 20 is to be a GaN-based high electron mobility transistor (HEMT) as a GaN-based heterojunction field effect transistor (FET).

Such the GaN-based semiconductor element 20 comprises a buffer layer 2 formed on a sapphire (0001) substrate 1, a channel layer (an electron transport layer) 3 comprised of a undoped GaN layer on the buffer layer 2, and an electron supply layer 4 comprised of a undoped AlGaN layer formed on the channel layer 3. Moreover, the GaN-based semiconductor element 20 comprises a gate electrode (G) 7, a source electrode (S) 6 and a drain electrode (D) 5 formed on the electron supply layer 4 respectively.

In such the GaN-based semiconductor element 20, a two-dimensional electron gas 8 is generated at an interface between the channel layer 3 and the electron supply layer 4 because the undoped AlGaN layer (the electron supply layer 4) is heterojunction connected to a surface of the undoped GaN layer (the channel layer 3) which is equivalent to a channel length L. Hence, the channel layer 3 becomes to be electro-conductive due to the two-dimensional electron gas 8 becoming a carrier. Moreover, the source electrode 6 and the drain electrode 5 are comprised of Ti, an alloy of Al and Si, and W to be formed as multilayer in order from the nearest region for the electron supply layer 4, that is to say, the structure of W/Al—Si/Ti on the electron supply layer 4.

An aspect of such the GaN-based semiconductor element 20 is that the buffer layer 2 formed on the sapphire (0001) substrate 1 is comprised of the electro-conductive semiconductor layer and the GaN-based semiconductor element 20 includes the structure to be able to control the electric potential of such the electro-conductive semiconductor layer (the buffer layer 2).

According to the present embodiment, the buffer layer 2 is comprised of an n-GaN layer having n-type conductivity. Moreover, a configuration is adopted according to the present embodiment, wherein the S 6 is implanted into epitaxial layers (the channel layer 3 and the electron supply layer 4) formed on the buffer layer 2 to be extended to a depth reaching the buffer layer 2 for ohmic contacting to the buffer layer 2.

It is possible to manufacture as follows regarding the GaN-based semiconductor element 20 comprising the above mentioned configuration. Here, a metal organic chemical vapor deposition (MOCVD) equipment is used for a growth system and the sapphire (0001) substrate 1 is used for a substrate.

1. First, the sapphire (0001) substrate 1 is to be introduced into a chamber of the MOCVD equipment, and the substrate is to be heated up to a temperature of 600° C. at a degree of vacuum of 100 hPa after vacuuming the chamber as not higher than $1 \times 10^{-6}$ hPa using a turbo molecular pump (TMP). After stabilizing the temperature thereof, a growth of the buffer layer 2 comprised of a GaN layer is to be performed by introducing raw materials of a trimethylaluminum (TMA) with a flow rate of 100 cm$^3$/min and an ammonia with the flow rate of 12 l/min respectively, onto the surface of the substrate 1 with rotating the substrate 1 as 900 rpm. Hence, the buffer layer 2 of approximately 50 nm thickness is able to be grown after a growth time of four minutes. Thus, the buffer layer 2 comprised of an n-GaN layer is formed, by doping an impurity of n-type into the buffer layer 2 comprised of the GaN layer thereafter.

2. Next, a growth of the channel layer (the electron transport layer) 3 is to be performed by introducing a trimethylgallium (TMG) with the flow rate of 300 cm$^3$/min and the ammonia with the flow rate of 12 l/min onto the buffer layer 2, after heating up the substrate 1 with the ammonia as the flow rate of 12 l/min to be held at the substrate temperature of 1050° C. Hence, the channel layer 3 of approximately 3000 nm thickness is able to be grown after a growth time of 2000 seconds.

3. Next, a growth of the electron supply layer 4 comprised of an $Al_{0.25}Ga_{0.75}N$ layer is to be performed by introducing the TMA with the flow rate of 50 cm$^3$/min, the TMG with the flow rate of 100 cm$^3$/min and the ammonia with the flow rate of 12 l/min onto the channel layer 3. Hence, the electron supply layer 4 of approximately 20 nm thickness is able to be grown after a growth time of 40 seconds. Thus, it becomes able to complete the layered structure shown in FIG. 1.

4. Next, an element separation is to be performed, using such as a chlorine-based gas or the like.

5. The drain electrode 5 is to be formed thereafter, by forming a SiO$_2$ insulating film layer, by opening parts for forming the source electrode 6 and the drain electrode 5 to expose a surface of the electron supply layer 4 by performing a patterning process with masking a part for forming the gate electrode 7 using the patterned SiO$_2$ film layer, and by depositing Ti, the alloy of Al and Si, and W in order thereunto.

6. The part for forming the source electrode 6 is to be removed by performing an etching process to the depth reaching the buffer layer 2 comprised of the n-GaN layer thereafter.

And, the source electrode 6 is to be formed to the depth reaching the buffer layer 2 for ohmic contacting thereto, by depositing Ti, the alloy of Al and Si, and W in order inside a ditch formed by removing the part at the etching process.

7. Next, the gate electrode 7 is to be formed, by removing the above mentioned SiO$_2$ film layer for masking the part for forming the gate electrode 7, by forming another SiO$_2$ film layer for masking the source electrode 6 and the drain electrode 5 with a open part for forming the gate electrode 7, and by depositing Ni and Au thereunto. As a result, it becomes able to manufacture the GaN-based semiconductor element (GaN-based HEMT) as shown in FIG. 1.

According to the first embodiment including the above mentioned structure, the following functions and advantages are able to be obtained.

It is able to fix the electric potential of the buffer layer 2 comprised of the n-GaN layer for being equal to the electric potential of the source electrode 6 because the source electrode 6 is ohmic contacted to the buffer layer 2 (the electro-conductive semiconductor) comprised of the n-GaN layer having n-type conductivity. That is to say, it becomes able to control the electric potential of the buffer layer 2 comprised of the n-GaN layer to be a predetermined electric potential by using the source electrode 6.

Therefore, it is able to suppress the current collapse (the current slump) occurred by being fluctuated the electric potential of the buffer layer 2 neighboring to the substrate 1 at the time of performing the high voltage switching. Hence, it becomes able to prevent the on-resistance from being increased and the element from cannot help but be consequently broken down due to occurring the current collapse.

It becomes able to realize the GaN-based semiconductor element 20 to be able to suppress the current collapse even at the time of performing the high voltage switching.

It is able to control the electric potential of the buffer layer 2 comprised of the n-GaN layer having n-type conductivity to be a predetermined electric potential by using the source electrode 6. Hence, it becomes able to suppress the current collapse occurred by being fluctuated the electric potential of the buffer layer 2 neighboring to the substrate 1 at the time of performing the high voltage switching.

Regarding the GaN-based heterojunction field effect transistor, the strongest electric field is applied to between the gate electrode 7 and the drain electrode 5 at the time of turning off, and the electric field flocks to around the edge of the gate electrode 7 at the drain electrode 5 side. However, according to the present embodiment, it becomes able to relax the flock of the electric field by controlling (fixing) the electric potential of the buffer layer 2 comprised of the n-GaN layer having n-type conductivity (to be a predetermined electric potential).

It is able to enhance the withstand voltage between the buffer layer 2 and the drain electrode 5 by forming the channel layer 3 comprised of the n-GaN layer to be the thickness of not less than 3000 nm. Thus, it becomes able to realize the GaN-based semiconductor element 20 for the high withstand voltage and the large current, having a high reliability with the high withstand voltage at the time of operating thereof.

Second Embodiment

Figure 2:
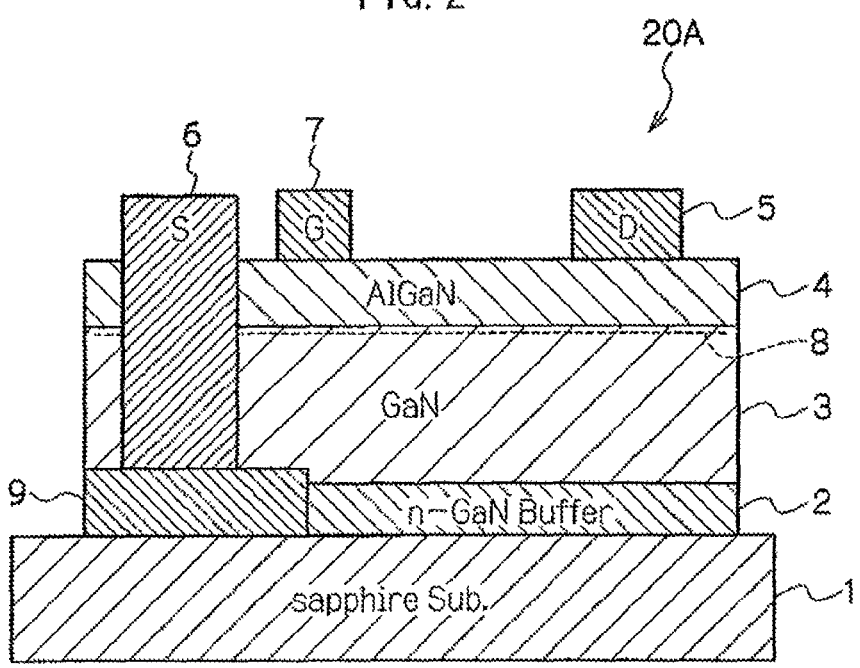
FIG. 2 is a cross sectional view showing a schematic configuration of a GaN-based semiconductor element according to the second embodiment of the present invention.

Next, a GaN-based semiconductor element 20A according to the second embodiment of the present invention will be described in detail below, based on FIG. 2.

An aspect of such the GaN-based semiconductor element 20A is that the following structure is to be adopted as a structure to be able to control an electric potential of a buffer layer 2 comprised of an n-GaN layer.

That is to say, in the structure to be able to control the electric potential of the buffer layer 2, there is provided a metal layer 9, which is selectively formed at a part except a region for forming the buffer layer 2 on a sapphire (0001) substrate 1, and which is ohmic contacted to the buffer layer 2. Moreover, the structure includes a configuration that a source electrode 6 is implanted into epitaxial layers (a channel layer 3 and an electron supply layer 4) formed on the buffer layer 2 and the metal layer 9, and that the source electrode 6 is extended to a depth reaching the metal layer 9 for electrically contacting thereto.

Such the metal layer 9 is to be formed using any of high melting metal materials, such as Ni, Nb, Mo, Ta, W, Re, Os, Ir, Pt, or the like.

It is possible to manufacture as follows regarding the GaN-based semiconductor element 20A comprising the above mentioned configuration.

1a. First, the metal layer 9 comprised of any of the high melting metal materials, such as Ni, Nb, Mo, Ta, W, Re, Os, Ir, Pt, or the like, is to be selectively formed at the part except the region for forming the buffer layer 2 on the sapphire (0001) substrate 1, before being the buffer layer 2 grown at the above mentioned process 1 described in the first embodiment. At the time thereof, it is preferable to form the metal layer 9 as thicker than the thickness of the buffer layer 2.

2a. The above mentioned processes 1 to 5 are to be performed thereafter.

3a. A part for forming the source electrode 6 is to be removed by performing an etching process to the depth reaching the buffer layer 2 comprised of the n-GaN layer thereafter. And, the source electrode 6 is to be formed to the depth reaching the buffer layer 2 for ohmic contacting thereto, by depositing Ti, an alloy of Al and Si, and W in order inside the ditch formed by removing the part at the etching process. Moreover, an upper part of the source electrode 6 is to be exposed from a top surface of the electron supply layer 4 at the time thereof.

4a. Next, a gate electrode 7 is to be formed by performing the above mentioned process 7. As a result, it becomes able to manufacture the GaN-based semiconductor element 20A (the GaN-based HEMT) as shown in FIG. 2.

According to the second embodiment including the above mentioned structure, the following functions and advantages are able to be obtained.

It is able to control (fix) the electric potential of the buffer layer 2 comprised of the n-GaN layer (the electro-conductive semiconductor layer) to be a predetermined electric potential by using the source electrode 6 and the metal layer 9. Hence, it becomes able to suppress the current collapse occurred by being fluctuated the electric potential of the buffer layer 2 neighboring to the substrate 1 at the time of performing the high voltage switching.

It becomes able to obtain the excellent ohmic contact by forming the metal layer 9 using any of the high melting metal materials, such as Ni, Nb, Mo, Ta, W, Re, Os, Ir, Pt, or the like.

Third Embodiment

Next, a GaN-based semiconductor element 20B according to the third embodiment of the present invention will be described in detail below, based on FIG. 3.

An aspect of such the GaN-based semiconductor element 20B is that the following structure is to be adopted as a structure to be able to control an electric potential of a buffer layer 2 comprised of an n-GaN layer.

That is to say, in the structure to be able to control the electric potential of the buffer layer 2, there is provided a metal layer 9, which is selectively formed on a part except a region for forming the buffer layer 2 on a sapphire (0001) substrate 1, and which is ohmic contacted to the buffer layer 2. Moreover, the structure includes a configuration that a mesa structure 11 is formed at a part of epitaxial layers (a channel layer 3 and an electron supply layer 4) formed on the buffer layer 2 to be deep for reaching the metal layer 9, and that an electrode 10 is formed on a part of a top surface of the metal layer 9 exposed by opening the part of the top surface of the metal layer 9.

It is possible to manufacture as follows regarding the GaN-based semiconductor element 20B comprising the above mentioned configuration.

1b. First, the metal layer 9 comprised of any of high melting metal materials, such as Ni, Nb, Mo, Ta, W, Re, Os, Ir, Pt, or the like, is to be selectively formed on the part of the region wherein the buffer layer 2 is formed on the sapphire (0001) substrate 1, before being the buffer layer 2 grown at the above mentioned process 1 described in the first embodiment.

2b. The above mentioned processes 1 to 4 are to be performed thereafter.

3b. A source electrode 6 and a drain electrode 5 are to be formed thereafter, by forming a SiO2 insulating film layer, by opening parts for forming the source electrode 6 and the drain electrode 5 with being the surface of the electron supply layer 4 exposed by performing a patterning process with masking a part for forming a gate electrode 7 using the patterned SiO2 film layer, and by depositing Ti, an alloy of Al and Si, and W in order thereunto.

4b. Next, the gate electrode 7 is to be formed by performing the above mentioned process 7.

5b. Next, the mesa structure 11 is to be formed to be deep for reaching the metal layer 9 at the part of the epitaxial layers (the channel layer 3 and the electron supply layer 4) formed on the buffer layer 2, by etching (dry etching) using such as a chlorine-based inductively coupled plasma (ICP) method or the like. Hence, the part of the metal layer 9 is to be opened and exposed thereby.

6b. Next, the electrode 10 is to be formed using a deposition method on a part of the metal layer 9 exposed by the dry etching. As a result, it becomes able to manufacture the GaN-based semiconductor element 20B (the GaN-based HEMT) as shown in FIG. 3.

According to the third embodiment including the above mentioned structure, the following functions and advantages are able to be obtained.

It is able to control (fix) the electric potential of the buffer layer 2 comprised of the n-GaN layer (the electro-conductive semiconductor layer) to be a predetermined electric potential by using the electrode 10 formed on the part of the metal layer 9 and the metal layer 9 to be ohmic contacted to the buffer layer 2. Hence, it becomes able to suppress the current collapse occurred by being fluctuated the electric potential of the buffer layer 2 neighboring to the substrate 1 at the time of performing the high voltage switching.

Moreover, it is also able to embody with modifying as follows regarding the present invention.

According to the above described every embodiment, the example is shown regarding the GaN-based heterojunction FET (GaN-based HEMT). However, the present invention is not limited to the GaN-based HEMT, as it is also applicable to a GaN-based semiconductor element, such as an MOSFET, a diode, a bipolar transistor, or the like, with using a GaN layer.

Moreover, the present invention is also applicable to a GaN-based semiconductor element, with using such as a SiC substrate, a Si substrate, a GaN substrate, a MgO substrate, a ZnO substrate, or the like, instead of the sapphire substrate.

According to the above described every embodiment, there is described as one example regarding the configuration that the buffer layer 2 is comprised of the n-GaN layer having n-type conductivity. However, the present invention is also applicable to a GaN-based semiconductor element comprised with using a buffer layer comprised of a layered structure of an AlN layer and a GaN layer and of an n-GaN layer having n-type conductivity formed on such the layered structure, or with using a buffer layer comprised of an n-AlN layer having n-type conductivity.

According to the above described first embodiment, the configuration is adopted, wherein the source electrode 6 is implanted into the epitaxial layers formed on the buffer layer 2 to be extended to the depth reaching the buffer layer 2 for ohmic contacting to the buffer layer 2. However, the present invention is not limited to such the configuration, as it is also applicable to a GaN-based semiconductor element comprising a configuration that another part of any of layers, which is comprised of any of metal materials and which is provided with the source electrode 6, is implanted into the epitaxial layers formed on the buffer layer 2 to be extended to the depth reaching the buffer layer 2 for ohmic contacting to the buffer layer 2.

Similarly, regarding the above described second embodiment, the present invention is also applicable to a GaN-based semiconductor element comprising a configuration that another part of any of layers, which is comprised of any of metal materials and which is provided with the source electrode 6, is implanted into the epitaxial layers formed on the buffer layer 2 to be extended to the depth reaching the metal layer 9 for electrically contacting to the metal layer 9.

Figure 3:
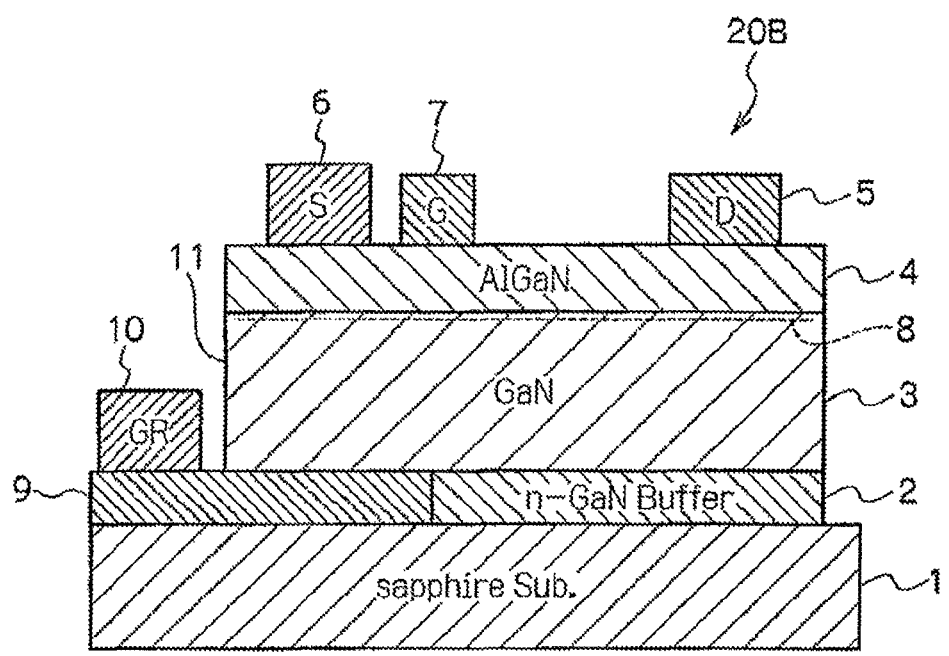
FIG. 3 is a cross sectional view showing a schematic configuration of a GaN-based semiconductor element according to the third embodiment of the present invention.

Furthermore, it is also able to obtain the similar functions and advantages by the configuration excluding the electrode 10 according to the above described third embodiment as shown in FIG. 3.

The present invention is not limited to the above described embodiments and various; further modifications may be possible without departing from the scope of the present invention.

This application is based on the published Japanese patent application No. 2006-173582 filed on Nov. 14, 2005 and the published Japanese patent application No. 2003-059948 filed on Aug. 20, 2001, entire content of which is expressly incorporated by reference herein.

What is claimed is:

1. A GaN-based semiconductor element, comprising:
   a substrate;
   a buffer layer formed on the substrate, the buffer layer including an electrically conductive portion;
   an epitaxial layer formed on the buffer layer; and
   a metal structure in ohmic contact with the electrically conductive portion of the buffer layer for controlling an electric potential of the buffer layer,
   wherein the buffer layer includes at least one selected from the group consisting of an n-GaN layer having n-type conductivity and an n-AlN layer having n-type conductivity, and
   the metal structure includes
   a metal layer in ohmic contact with the electrically conductive portion of the buffer layer at a part of a region where the buffer layer is formed on the substrate, and
   an electrode implanted into the epitaxial layer to extend to a depth reaching the metal layer to be in electrical contact with the metal layer.

2. The GaN-based semiconductor element according to claim 1, wherein the metal layer is formed of at least one selected from the group consisting of Ni, Nb, Mo, Ta, W, Re, Os, Ir, and Pt.

3. A semiconductor element, comprising:
   a substrate;
   a buffer layer formed on the substrate, the buffer layer including an electrically conductive portion;
   an epitaxial layer formed on the buffer layer and configured to generate a two-dimensional electron gas in a portion thereof; and
   a metal structure for controlling an electric potential of the buffer layer,
   wherein the metal structure is in direct ohmic contact with the electrically conductive portion of the buffer layer at a level below the portion of the epitaxial layer where the two-dimensional electron gas is to be generated.

4. The semiconductor element according to claim 3, further comprising a source electrode, a gate electrode, and a drain electrode formed on the epitaxial layer,
   wherein the metal structure comprises the source electrode.

5. The semiconductor element according to claim 3, wherein the metal structure includes a metal layer formed on the substrate, in direct ohmic contact with the electrically conductive portion of the buffer layer, and at least partially co-elevational with the buffer layer.

6. The semiconductor element according to claim 5, further comprising
   a mesa structure formed in a part of the epitaxial layer to expose a portion of the metal layer; and
   the metal structure further comprises an electrode formed on the exposed portion of the metal layer.

7. The semiconductor element according to claim 5, wherein the metal layer is thicker than the buffer layer.

8. The semiconductor element according to claim 3, wherein
   the epitaxial layer includes a channel layer of undoped GaN formed on the buffer layer, and an electron supply layer of AlGaN formed on the channel layer; and
   the portion where the two-dimensional electron gas is to be generated is in the channel layer near an interface between the electron supply layer and the channel layer.

9. The semiconductor element according to claim 3, wherein the epitaxial layer includes GaN-based semiconductor materials.

10. The semiconductor element according to claim 3, wherein the buffer layer includes at least one selected from the group consisting of an n-GaN layer having n-type conductivity and an n-AlN layer having n-type conductivity.

11. The GaN-based semiconductor element according to claim 3, wherein the buffer layer includes an n-GaN layer having n-type conductivity.

12. The GaN-based semiconductor element according to claim 11, wherein
   the buffer layer further includes a layered structure of an AlN layer and a GaN layer, and
   the n-GaN layer is formed on the layered structure.

13. The GaN-based semiconductor element according to claim 3, wherein the buffer layer includes an n-AlN layer having n-type conductivity.

* * * * *